United States Patent [19]

Berger

[11] 4,000,504
[45] Dec. 28, 1976

[54] DEEP CHANNEL MOS TRANSISTOR

[75] Inventor: Josef Berger, Sunnyvale, Calif.

[73] Assignee: Hewlett-Packard Company, Palo Alto, Calif.

[22] Filed: May 12, 1975

[21] Appl. No.: 576,419

[52] U.S. Cl. .............................. 357/23; 357/91; 307/238; 307/304
[51] Int. Cl.² ...................................... H01L 29/78
[58] Field of Search ............ 357/23, 91; 307/238, 307/304

[56] References Cited

UNITED STATES PATENTS

| 3,283,221 | 11/1966 | Heiman | 357/23 |
| 3,631,308 | 12/1971 | Krolikowski | 357/23 |
| 3,676,715 | 7/1972 | Brojdo | 357/23 |
| 3,814,992 | 6/1974 | Kump et al. | 357/23 |
| 3,906,296 | 9/1975 | Maserjian et al. | 357/23 |
| 3,916,268 | 10/1975 | Engeler et al. | 357/23 |

OTHER PUBLICATIONS

D. Kahng et al., "A Fl. Gate and its Appl. to Mem. DeV₂," Bell. Tel. Tech. J., vol. 46, Aug. 1967, pp. 1288–1295.
M. Lenzlinger et al., "Fowler–Nordheim Tunneling into Thermally Grown SiO₂," J. Appl. Phys., vol. 40, No. 1, Jan. 1969, pp. 278–283.
R. Oakley, "MNOS: A New Non-Volatile Store," Compon. Technol. (G.B.), vol. 4, No. 5, Oct. 1970, pp. 17–21.
B. Agusta et al., "Nonvolatile Imaging Devices," IBM Tech. Discl. Bull., vol. 15, No. 9, Feb. 1973, p. 2821.
C. Bosselaar, "Charge Injection into SiO₂ from Rev. Biased Jens.," S.S. Electronics, vol. 16, May 1973, pp. 648–651.
J. Verwey et al., "ATMOS–An Elect. Reprog. Read-Only Mem. Device," IEEE Trans. on Elec. Dev., vol. ED–21, No. 10, Oct. 1974, pp. 631–636.

Primary Examiner—Michael J. Lynch
Assistant Examiner—Joseph E. Clawson, Jr.
Attorney, Agent, or Firm—Ronald E. Grubman

[57] ABSTRACT

A semiconductor charge storage and detection device is provided in which an ion implanted conductive channel is buried between source and drain regions in the bulk of a semiconductor substrate. A charge storage region extends between the channel and the surface of the semiconductor device. The charge storage region is isolated from the semiconductor substrate and may be depleted of charge or enabled to store charge depending upon the electrical potential applied to a gate electrode at the surface of the device. The amount of charge stored may be detected by sensing the conductance of the buried channel. The device may be variously configured, e.g. as a non-destructive readable photosensor or as a memory cell.

6 Claims, 8 Drawing Figures

DEEP CHANNEL MOS TRANSISTOR

BACKGROUND AND SUMMARY OF THE INVENTION

The non-uniform implantation of impurities in a semiconductor substrate has been employed to form buried channel charge transfer devices. The present invention utilizes a non-monotonic doping of donor type impurity ions in a semiconductor to produce a buried conduction channel in the semiconductor. Between the conductive channel and the surface of the semiconductor there is a region implanted with acceptor ions to serve as a charge storage region. According to preferred embodiments of the invention this region is conductively isolated from the remainder of the semiconductor body by the buried conductive channel and portions of an insulating region on the substrate. A gate electrode is positioned at the surface of the semiconductor and separated from the semiconductor by the insulating layer.

In operation, an electrical potential of appropriate magnitude and sign is applied to the gate electrode to deplete the buried conduction channel and thereby render the channel non-conductive. At this point in the operating cycle, majority carriers may begin to accumulate in the isolated charge storage region at the surface of the semiconductor. This charge may result from thermal or optical generation in the storage region, or from charge injection into the region. As increasing amounts of charge accumulate, an electric field is generated which tends to cancel the electrical field imposed by the gate electrode; the buried conduction channel is thereby restored to a conductive mode. By monitoring the conduction of the buried channel, it is possible to detect accumulated charge in the storage region. Thus, for example, if charge accumulates as a result of optical generation, the device may function as a transistor photodetector. If charge is injected into the charge storage region, the device may function as a memory.

DETAILED DESCRIPTION OF THE INVENTION

Figure 1:
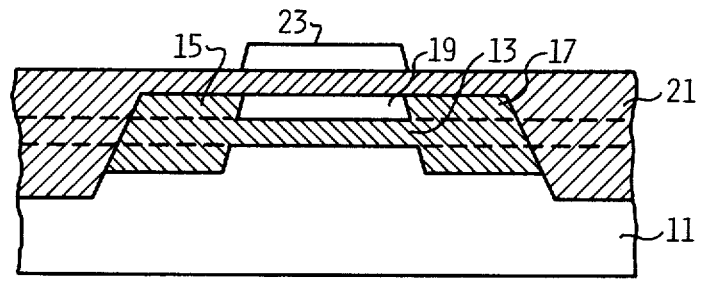
FIG. 1 is a cross-sectional view along a buried conduction channel according to a preferred embodiment of the invention.
Figure 3:
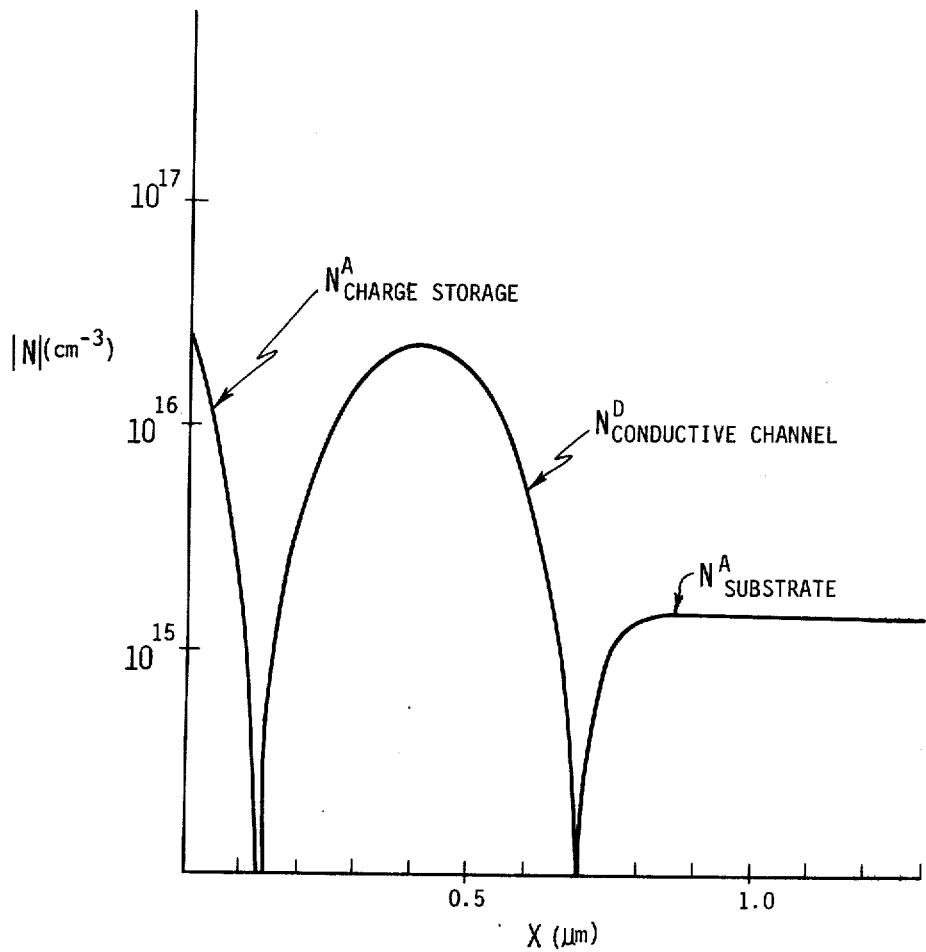
FIG. 3 is a graphical representation of typical dopant profiles in a deep channel transistor.

Reference will now be made to FIGS. 1 and 3. In FIG. 1, there is shown a substrate 11 of a semiconductor material, which for purposes of illustration only will be described as a P-type material. It will be understood by those skilled in the art that devices such as that described hereafter may also be constructed wherein an N-type substrate is employed, in which case suitable potentials and materials will be substituted for those disclosed below in connection with the present example. In the case of a P-type substrate (e.g., an acceptor doping of about 1 to $5 \times 10^{15}$ cm.$^{-3}$ as shown in FIG. 3) a buried conduction layer is formed in the substrate, e.g. by implanting a layer of donor impurity ions 13 in substrate 11. In some devices which have been fabricated, buried channel 13 was formed by implanting 440 KeV phosphorous ions in an integrated dosage of about $7.5 \times 10^{11}$ cm.$^{-2}$. For simplicity of fabrication, this donor ion implantation may be performed across the entire substrate as indicated by the dotted lines in FIG. 1. Subsequent fabrication steps to be described below will insure that the ultimately formed conductive channel is limited to a desired configuration. In FIG. 3, the curve labeled $N^D_{conductive\ channel}$ schematically represents a distribution of donor ions in substrate 11 which effectively forms a buried conduction channel. Such a channel may alternatively be formed by other methods known in the art, such as epitaxial growth of an N-type channel on the P-type substrate.

In the embodiment illustrated in FIG. 1 a source region 15 and a drain region 17, both of conductivity type opposite that of substrate 11, are also formed in substrate 11, e.g. by diffusion of phosphorous. Concentrations of about $1 \times 10^{19}$ to $1 \times 10^{20}$ cm.$^{-3}$ have been utilized. Source region 15, drain region 17, and conductive channel 13 effectively form a buried channel transistor in substrate 11.

Adjacent conductive channel 13 is a charge storage region 19 which may be formed, e.g. by implantation of acceptor ions in the substrate; 40 KeV boron ions in an integrated dosage of about $7 \times 10^{11}$ cm.$^{-2}$ have been used effectively. In FIG. 3, the curve labeled $N^A_{charge\ storage}$ represents a typical distribution of acceptor ions in region 19. Charge storage region 19 may also be formed by epitaxial growth, or by other techniques known in the art. An insulating layer 21 such as of $SiO_2$ extends over the surface of the substrate. A gate electrode 23 is positioned on the insulating layer above charge storage region 19, and in preferred embodiments is fabricated of an optically transparent material such as thin phosphorous doped polysilicon or indium-tin oxide. In FIG. 1 it may be seen that storage region 19 is isolated from substrate 11 by channel 13 and source and drain regions 15 and 17, respectively.

Figure 2:
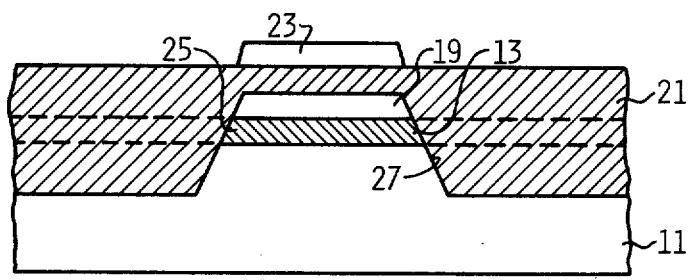
FIG. 2 is a cross-sectional view across the conduction channel.

In FIG. 2, there is again illustrated substrate 11, insulating layer 21, and gate electrode 23 on the insulating layer above charge storage region 19. In this figure the isolation of charge storage region 19 from substrate 11 will be more fully appreciated. More particularly, it can be seen that conductive channel 13 extends from a first surface 25 of insulating region 21 to a second surface 27 of the insulating region. Thus, from FIGS. 1 and 2 it can be seen that charge storage region 19 is completely isolated from substrate 11 by the configuration of conduction channel 13. Charge which is generated in region 19 or is injected into that region will therefore accumulate there and not be dissipatd into substrate 11. Conversely, charge carriers generated in substrate 11 will not migrate into storage region 19.

Figure 4A:
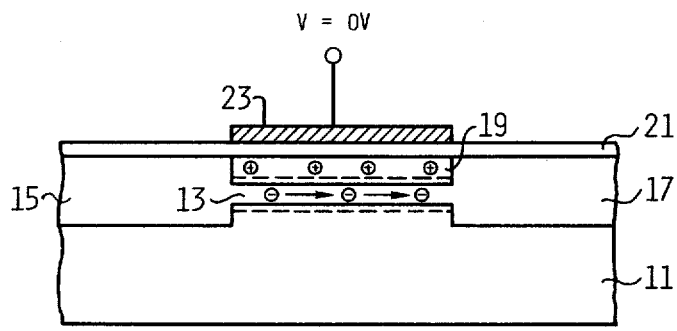
FIGS. 4a–4d illustrate sequential states of the transistor during operation.
Figure 4B:
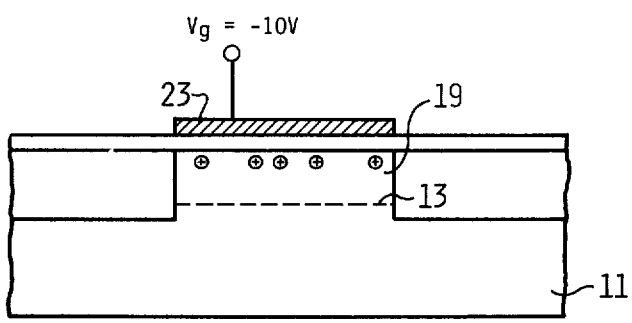

Operation of the device may be understood now by reference to FIG. 3 and FIGS. 4a–4d. In FIG. 4a, gate electrode 23 is shown as being grounded and held at zero potential. In this mode only a small amount of positive charge is present in charge storage region 19. Conductive channel 13 will be "on" so that majority carriers (electrons in this example) are free to be transferred from source 15 to drain 17 across channel 13. In FIG. 4b, the gate voltage on electrode 23 is shown as having been rapidly reduced to a large negative potential. By "large" is here meant that the potential is of sufficient magnitude to deplete channel 13 of majority carriers. The voltage must not, however, exceed the breakdown voltage of insulating layer 21. In devices built according to dimensions and materials disclosed above, utilizing doping profiles typified by FIG. 3, about −10 volts has proved adequate to deplete channel 13 so that conduction between source 15 and drain 17 ceases. Under these conditions charge storage region 19 is also depleted and is enabled to store positive charges which are generated in or injected into that region. Since charge storage region 19 is isolated from substrate 11 as described above, accumulation of charge in the region must result from thermal or light generation in region 19 itself, or by injection of charge into the charge storage region. Any charge carriers which are generated in substrate 11 will be unable to overcome a potential barrier created by the fixed charges implanted in channel 13, and will therefore not penetrate into storage region 19.

Figure 4C:
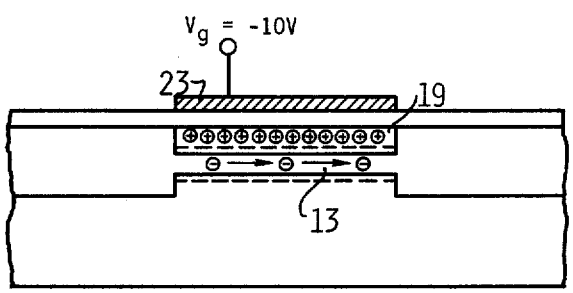

FIG. 4c illustrates an accumulation of charge in region 19. As positive charges accumulate in region 19 as a result of thermal or optical generation or injection, the electrical potential seen by channel 13 due to the accumulated charge gradually tends to cancel the large negative potential imposed by gate electrode 23. As the gate electrode field is effectively neutralized in the region of conduction channel 13, the conduction channel will be rendered conductive once again so that charge carriers can flow between source region 15 and drain region 17. This conduction may then be monitored to provide an indication of the amount of charge stored in region 19.

Figure 4D:
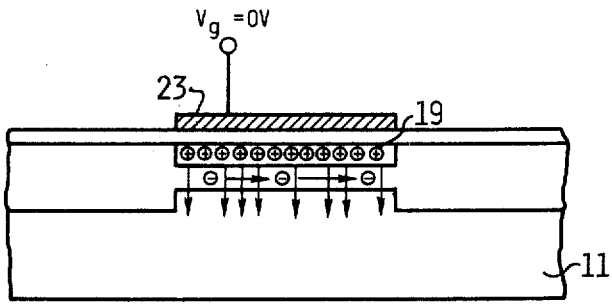

In FIG. 4d, gate electrode 23 is returned to a zero potential to reset the device. When the gate is reset the extra charge stored in region 19 is injected into substrate 11 as indicated by the arrows, and the device is restored to the initial conditions described in connection with FIG. 4a.

Figure 5:
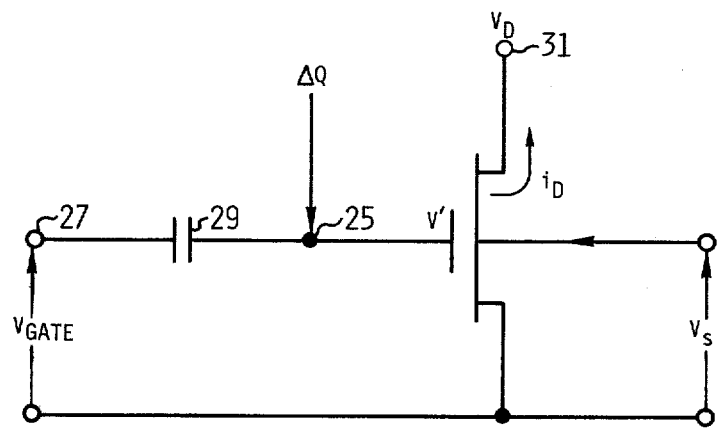
FIG. 5 is an example of an equivalent circuit for a phototransistor in accordance with aspects of the invention.

Utilization of the deep channel transistor for detection of light may be understood by reference now to FIG. 5 (references to numerals included in earlier figures refer to those figures). In FIG. 5, charge storage region 19 is represented by a node 25. A gate voltage appearing on gate electrode 23 appears at point 27 of the equivalent circuit. An equivalent capacitance 29 represents the capacitance of insulating layer 21 which couples gate voltage 27 to node 25. Node 25, therefore, represents an "effective gate" of a deep channel transistor including source and drain regions 15 and 17 and a channel region 13. The voltage appearing at this effective gate 25 is designated in FIG. 5 as $V'$. A voltage designated $V_{Substrate}$ indicates the voltage between the source and drain regions and the substrate of the deep channel transistor. Another voltage appearing at node 31 and designated $V_D$ represents an external drain voltage applied to drain region 17. For given drain voltage $V_D$, a transistor current flow designated $I_D$ depends on the effective gate voltage $V'$. In accordance with the principles of the invention, this effective gate voltage is determined in part by the actual voltage $V_{gate}$ capacitively coupled to the effective gate 25, and also depends in part on the amount of charge stored in charge storage region 19, the stored charge being designated $\Delta Q$ in FIG. 5. For operation as a photodetector, gate electrode 23 is fabricated from a transparent or semi-transparent conductor conducting material, e.g. a polysilicon gate about 3500 Å thick. The device is then illuminated through gate electrode 23 to produce optically generated charge carriers in charge storage region 19. Positive charges so generated are accumulated and stored in this region. As charge accumulates the effective gate voltage $V'$ becomes more positive which gradually increases the conductivity of the deep channel transistor. Measurement of the conductance of the transistor therefore provides an indication of the total charge accumulated in region 19.

In alternate embodiments charge may be controllably injected into and stored in storage region 19 when the gate electrode voltage is suitably negative. The charge may then be injected into substrate 11 by restoration of the gate electrode potential to zero. Detection of the presence or absence of charge in region 19 may be accomplished by a measurement of the conductance of the buried channel transistor as described above. Thus, if the presence of charge is used to indicate a binary 1 and the absence of charge represents a binary 0, the device may function as a memory cell.

I claim:
1. A semiconductor device comprising:
   a semiconductor substrate of a first conductivity type;
   a semiconductor source region of a second conductivity type in the substrate;
   a semiconductor drain region of said second conductivity type in the substrate;
   a semiconductor channel region of said second conductivity type in the substrate, the channel region interconnecting the source and drain regions;
   an insulating region on the substrate;
   a gate electrode on the insulating region; and
   a semiconductor charge storage region of said first conductivity type positioned between the channel region and the insulating region in the substrate beneath the electrode, and being completely separated from the remainder of the substrate by the channel region and portions of at least one of the source region, drain region, and insulating region.

2. A semiconductor device as in claim 1 wherein said charge storage region includes a concentration of ions of said first conductivity type which allows substantial depletion of said storage region by the first voltage applied to said gate electrode, the charge storage region being thereby enabled to accumulate and store charge carriers.

3. A semiconductor device as in claim 2 wherein the charge storage region and the channel region include concentrations of ions of said first conductivity type and said second conductivity type respectively which allow depletion of majority charge carriers from the channel region when the first voltage is applied to the gate electrode, thereby rendering the channel region nonconductive between the source and drain regions.

4. A semiconductor device as in claim 3 wherein said charge storage region and the channel region include concentrations of ions of said first conductivity type and said second conductivity type respectively, which allow injection into the substrate of the charge stored in the storage region when a second voltage and of a magnitude less than the electrical breakdown voltage of the insulating region is applied to the gate electrode.

5. A semiconductor device as in claim 1 wherein the channel region is an ion-implanted region in the substrate.

6. A semiconductor device as in claim 1 wherein the gate electrode is of an optically semi-transparent material for allowing optical radiation to impinge on the charge storage region to generate charge carriers therein.

* * * * *

UNITED STATES PATENT AND TRADEMARK OFFICE
CERTIFICATE OF CORRECTION

PATENT NO. : 4,000,504
DATED : December 12, 1976
INVENTOR(S) : Josef Berger

It is certified that error appears in the above-identified patent and that said Letters Patent are hereby corrected as shown below:

Column 4, line 58, delete the word "and" after the word "voltage".

Signed and Sealed this

Eighth Day of March 1977

[SEAL]

Attest:

RUTH C. MASON
*Attesting Officer*

C. MARSHALL DANN
*Commissioner of Patents and Trademarks*